(12) United States Patent
Iwanami

(10) Patent No.: US 6,963,034 B2
(45) Date of Patent: Nov. 8, 2005

(54) MULTILAYER PRINTED BOARD WITH A DOUBLE PLANE SPIRAL INTERCONNECTION STRUCTURE

(75) Inventor: Mizuki Iwanami, Tokyo (JP)

(73) Assignee: NEC Corporation, Tokyo (JP)

( * ) Notice: Subject to any disclaimer, the term of this patent is extended or adjusted under 35 U.S.C. 154(b) by 348 days.

(21) Appl. No.: 10/093,482

(22) Filed: Mar. 11, 2002

(65) Prior Publication Data

US 2002/0109573 A1    Aug. 15, 2002

Related U.S. Application Data

(62) Division of application No. 09/568,590, filed on May 11, 2000, now Pat. No. 6,384,706.

(30) Foreign Application Priority Data

May 11, 1999    (JP) ................................ 11-130609

(51) Int. Cl.[7] .............................................. H05K 1/16
(52) U.S. Cl. ...................................... 174/260; 361/761
(58) Field of Search ........ 174/260, 262; 361/761–764, 361/780, 792–795

(56) References Cited

U.S. PATENT DOCUMENTS

| 5,801,521 A | | 9/1998 | Mizoguchi et al. |
| 5,978,231 A | * | 11/1999 | Tohya et al. ................ 361/782 |
| 6,140,902 A | | 10/2000 | Yamasawa et al. |

FOREIGN PATENT DOCUMENTS

| EP | 0 880 150 A2 | 11/1998 |
| GB | 2 321 787 A | 8/1998 |
| JP | 9-326451 | 12/1997 |
| JP | 10-215134 | 8/1998 |

* cited by examiner

Primary Examiner—Randy Gibson
Assistant Examiner—Jeremy Norris
(74) Attorney, Agent, or Firm—Young & Thompson

(57) ABSTRACT

An inductor device having plural spiral-shaped interconnection structures connected to each other and extending in plural power source layers, the power source layers being in different levels of a multilayer printed board. The printed board having first and second current loops. The loops share part of a common current path.

10 Claims, 11 Drawing Sheets

MULTILAYER PRINTED BOARD WITH A DOUBLE PLANE SPIRAL INTERCONNECTION STRUCTURE

BACKGROUND OF THE INVENTION

The present invention relates to a multilayer printed board, and more particularly to a multilayer printed board with a double plane spiral interconnection structure for suppressing electromagnetic interference.

The multilayer printed board has a power source layer and a ground layer. A high frequency current flows through the power source layer to operate integrated circuits or large scale integrated circuits. It is necessary to prevent the high frequency current from so flowing as to draw a large current loop between the power source layer and the ground layer. In Japanese laid-open patent publication No. 9-139573, it is disclosed to emphasize the power de-coupling, wherein the power source layer has interconnections which include an impedance-circuit in the form of zigzag, winding crossing or spiral for forming an impedance, and also insulation layers sandwiching the power source layer are made of an insulator mixed with a magnetic material.

The conventional multilayer printed board has the following two problems.

The first problem is that when the IC or LSI mounted on the multilayer printed board operates, a high frequency current flows from the IC or LSI to the power source layer, whereby a power system comprising the power source layer and the ground layer allows a large current loop serving as a looped antenna from which electromagnetic waves as noises are radiated.

The second problem is that in switching IC or LSI, a current from the power source layer to the IC or LSI causes a voltage variation the power source layer. This voltage variation causes a stationary wave in the power system serving as a looped antenna from which electromagnetic waves as noises are radiated.

In the above circumstances, it had been required to develop a novel multilayer printed board free from the above problem.

SUMMARY OF THE INVENTION

Accordingly, it is an object of the present invention to provide a novel multilayer printed board free from the above problems.

It is a further object of the present invention to provide a novel multilayer printed board capable of suppressing a radiation electromagnetic noise from a power source layer of the multilayer printed board.

The first present invention provides an inductor device comprising plural spiral-shaped interconnection structures being connected to each other and extending in plural power source layers differing in level in a multilayer printed board, wherein the plural spiral-shaped interconnection structures.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
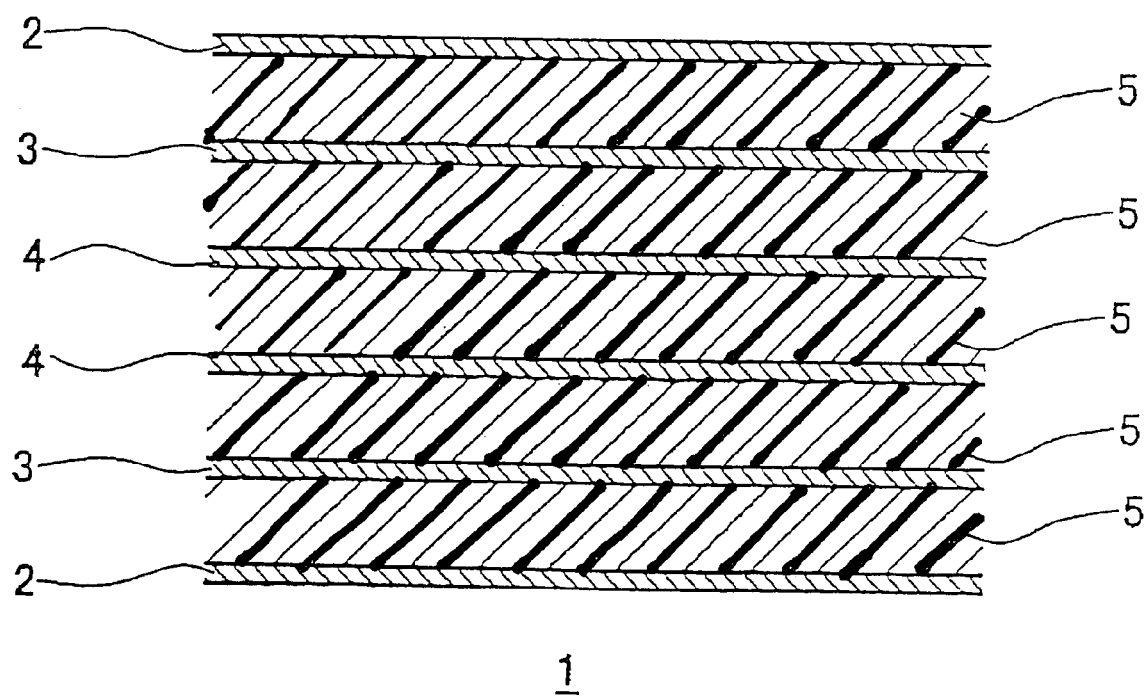
FIG. 1 is a fragmentary cross sectional elevation view illustrative of a multilayer printed board to which the present invention is applied in a first preferred embodiment in accordance with the present invention.

The first present invention provides an inductor device comprising plural spiral-shaped interconnection structures being connected to each other and extending in plural power source layers differing in level in a multilayer printed board.

It is preferable that the plural spiral-shaped interconnection structures comprises first and second spiral-shaped interconnection structures extending in first and second power source layers in first and second levels, respectively.

It is also preferable that the multilayer printed board has at least a first high frequency current loop with a first loop area and a second high frequency current loop with a second loop area which is larger than the first loop area, and the first high frequency current loop and the second high frequency current loop have a partially common current path, and the first frequency current loop has a first current path including any one of the paired power source layers and excluding the inductor device and remaining one of the paired power source layers.

It is also preferable that the plural spiral-shaped interconnection structures extends in plane and are connected to each other at these center portions.

It is also preferable that the plural spiral-shaped interconnection structures have the same current directions as each other.

It is also preferable that each of the plural spiral-shaped interconnection structures has a spiral pitch of not more than 1 mm.

It is also preferable to further comprise an inside insulative magnetic layer between adjacent two of the plural spiral-shaped interconnection structures. In this case, it is further preferable that the inside insulative magnetic layer comprises a mixture of a resin material and magnetic powders. It is furthermore preferable to further comprise outside insulative magnetic layers in opposite sides of the plural power source layers so that the plural power source layers are positioned between the outside insulative magnetic layers. In this case, it is also preferable that the outside insulative magnetic layers comprise a mixture of a resin material and magnetic powders.

It is also preferable that, in the multilayer printed board, dielectric layers sandwiching the power source layers are higher in dielectric loss than other dielectric layers.

The second present invention provides a multilayer printed board having plural signal layers, plural power source layers, plural ground layers, and the multilayer printed board also having at least a first high frequency current loop with a first loop area and a second high frequency current loop with a second loop area which is larger than the first loop area, and the first high frequency current loop and the second high frequency current loop have a partially common current path, wherein the multilayer printed board further has at least an inductor device in the plural power source layers, so that the first frequency current loop has a first current path including any one of the paired power source layers and excluding the inductor device and remaining one of the paired power source layers.

It is preferable that the at least inductor device comprises plural spiral-shaped interconnection structures being connected to each other and extending in plural power source layers differing in level in a multilayer printed board, wherein the plural spiral-shaped interconnection structures.

It is also preferable that the plural spiral-shaped interconnection structures comprises first and second spiral-shaped interconnection structures extending in first and second power source layers in first and second levels, respectively.

It is also preferable that the plural spiral-shaped interconnection structures extend in plane and are connected to each other at these center portions.

It is also preferable that the plural spiral-shaped interconnection structures have the same current directions as each other.

It is also preferable that each of the plural spiral-shaped interconnection structures has a spiral pitch of not more than 1 mm.

It is also preferable to further comprise an inside insulative magnetic layer between adjacent two of the plural spiral-shaped interconnection structures. In this case, it is also preferable that the inside insulative magnetic layer comprises a mixture of a resin material and magnetic powders. It is further more preferable to further comprise outside insulative magnetic layers in opposite sides of the plural power source layers so that the plural power source layers are positioned between the outside insulative magnetic layers. In this case, it is also preferable that the outside insulative magnetic layers comprise a mixture of a resin material and magnetic powders.

It is also preferable that, in the multilayer printed board, dielectric layers sandwiching the power source layers are higher in dielectric loss than other dielectric layers.

The present invention provides a multilayer printed board having a power source layer in the vicinity of a device such as an integrated circuit or a large scale integrated circuit, wherein the power source layer has a double plane spiral interconnection structure which comprises a first level interconnection extending in the shape of spiral included in a first level plane and a second level interconnection extending in the shape of spiral included in a second level plane, and the first level and second level interconnections are connected to each other at those center positions so that a current direction is the same between the first level and second level interconnections.

The above double plane spiral interconnection structure in the vicinity of the device such as the IC or LSI serves as an inductor device which emphasizes the power de-coupling of the IC or LSI. This emphasis of the power de-coupling of the IC or LSI reduces an effective area of a loop of a high frequency current generated in a power system comprising the power source layer and a ground layer. The above double plane spiral interconnection structure in the power source layer increases a loss due to electromagnetic wave propagation through the power system comprising the power source layer and the ground layer. Namely, the above double plane spiral interconnection structure in the power source layer increases a conductor loss due to a conductor existing in the power source layer and a dielectric loss due to a dielectric existing in the power system comprising the power source layer and the ground layer. The increase of the loss due to electromagnetic wave propagation or the conductor loss and the dielectric loss causes an attenuation of the stationary wave generated in the power system.

It is also available that an insulation magnetic material layer is provided between the first level and second level interconnections so that the insulation magnetic material layer extends in an entire region of the multilayer printed board.

The provision of the insulation magnetic material layer between the first level and second level interconnections increase an inductance of the inductor device comprising the double plane spiral interconnection structure because the magnetic material contained in the insulation magnetic material layer has a complex relative permeability with a real part of not less than 1. The increase in inductance of the inductor further emphasizes the de-coupling of the IC or LSI. This further emphasis of the de-coupling of the IC or LSI further reduces the effective area of the loop of the high frequency current generated in the power system comprising the power source layer and a ground layer. In a frequency range, where an imaginary part of the above complex relative permeability of the magnetic material contained in the insulation magnetic material layer is more than 0, the magnetic material causes the loss due to the electromagnetic wave propagation. The increase of the loss due to electromagnetic wave propagation causes a further attenuation of the stationary wave generated in the power system.

Preferred Embodiment

First Embodiment:

A first embodiment according to the present invention will be described in detail with reference to the drawings. FIG.

1 is a fragmentary cross sectional elevation view illustrative of a multilayer printed board to which the present invention is applied in a first preferred embodiment in accordance with the present invention. The multilayer printed board comprises alternating laminations of a plurality of dielectric layers 5 and any one of signal layers 2, ground layers 3 and power source layers 4. One of the dielectric layers 5 is sandwiched between the two power source layers 4. The two power source layers 4 are further sandwiched between the other two dielectric layers 5 to form a five layer lamination structure. This five layer lamination structure is further sandwiched between the two ground layers 3 to form a seven layer lamination structure. This seven layer lamination structure is further sandwiched between the still other two dielectric layers 5 to form a nine layer lamination structure. This nine layer lamination structure is furthermore sandwiched between the signal layers 2.

Figure 2A:
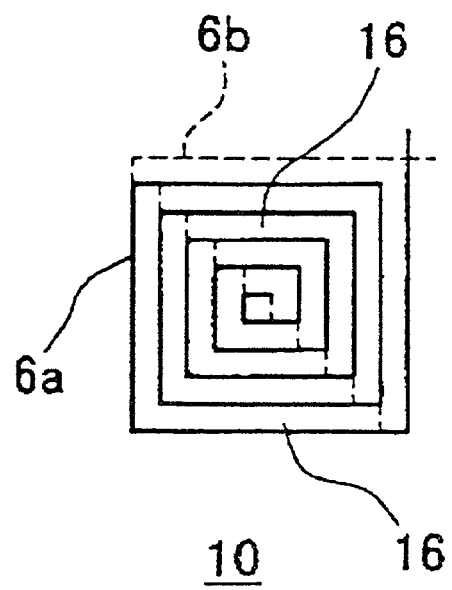
FIG. 2A is a plan view illustrative of an inductor device provided in a power source layer in the multilayer printed board of FIG. 1.
Figure 2B:
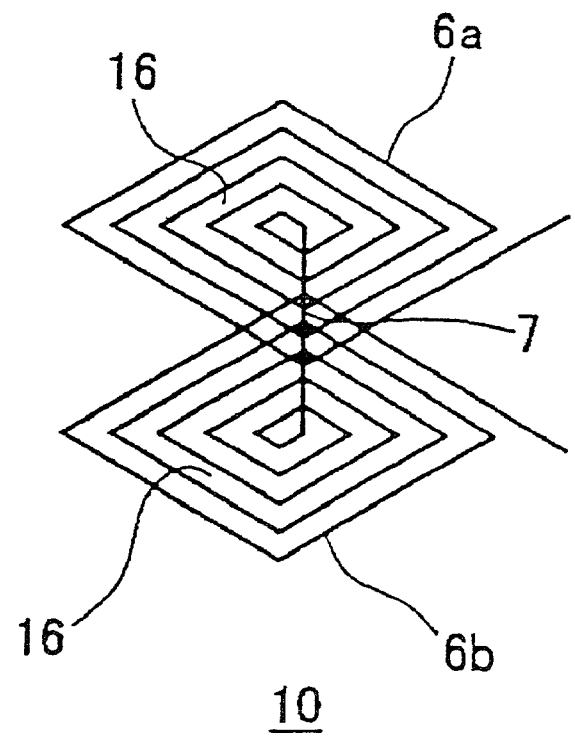
FIG. 2B is a perspective view illustrative of an inductor device provided in a power source layer in the multilayer printed board of FIG. 1.

FIG. 2A is a plan view illustrative of an inductor device provided in a power source layer in the multilayer printed board of FIG. 1. FIG. 2B is a perspective view illustrative of an inductor device provided in a power source layer in the multilayer printed board of FIG. 1. Each of the power source layers 4 in the vicinity of an IC or an LSI has an inductor device 10. The indicator device 10 comprises a pair of at least two spiral-formed interconnection structures, each of which comprises an interconnection extending in the plane of the power source layers 4 in the form of a spiral. The paired two spiral-formed interconnection structures are formed in adjacent two different level power source layers 4 which are isolated by the single dielectric layer 5, wherein the paired two spiral-formed interconnection structures extend to form parallel planes to each other, so that the paired two spiral-formed interconnection structures are positioned to overlap to each other and two planes formed by the paired two spiral-formed interconnection structures face to each other. The paired two spiral-formed interconnection structures are connected to each other to form a spiral current loop pair. Usually, it is preferable that center portions of the paired two spiral-formed interconnection structures are connected through a connection line extending in a vertical direction to the planes of the paired two spiral-formed interconnection structures as shown in FIG. 2B. The connection line extends through the dielectric layer 5 in the vertical direction to the planes of the paired two spiral-formed interconnection structures. Notwithstanding, it is possible as a modification to the above structure that the paired two spiral-formed interconnection structures are connected at other positions than the center portions. In this modified case, the paired two spiral-formed interconnection structures are connected through the connection line which extends through the dielectric layer 5 in the vertical direction to the planes of the paired two spiral-formed interconnection structures. It is preferable that currents flow through the spiral-formed interconnections in the same spiral directions between the paired two spiral-formed interconnection structures. It is, however, possible as a modification to the above structure that currents flow through the spiral-formed interconnections in opposite spiral directions between the paired two spiral-formed interconnection structures, even in this case, an obtained inductance is smaller than the above case where the currents flow in the same spiral directions. In FIGS. 2A, and 2B, the lower one 6b of the paired two spiral-formed interconnection structures is represented by "6b", whilst the upper one thereof is represented by "6a". It is possible that the spiral shape is square as shown in FIGS. 2A and 2B. It is, however, possible to modify the square shape of the spiral into other shapes, for example, rectangles, circles, and ovals. It is also preferable that a pitch of the spiral is not more than 1 mm in order to keep a high inductance of the inductor device 10.

As described above, the inductor device 10 comprises the paired two spiral-formed interconnection structures. This inductor device 10 is provided in the power source layer 4 but in the vicinity of the IC or LSI. This inductor device 10 provides a high impedance to the high frequency current flowing through the power system in the multilayer printed board. This high impedance to the high frequency current causes that a majority of the high frequency current flowing from the IC or LSI through the power source layer is by-passed to a capacitor which is positioned nearest thereto, thereby to reduce a high frequency current loop formed in the power system of the multilayer printed board.

The inductor device 10 also serves to attenuate the stationary wave to be generated in the power source layer in the multilayer printed board. The above paired two spiral-formed interconnection structures increase the loss in the electromagnetic wave propagation through the power system in the multilayer printed board.

Accordingly, the inductor device 10 suppresses the electromagnetic noises radiated from the power system in the multilayer printed circuit board.

Figure 3:
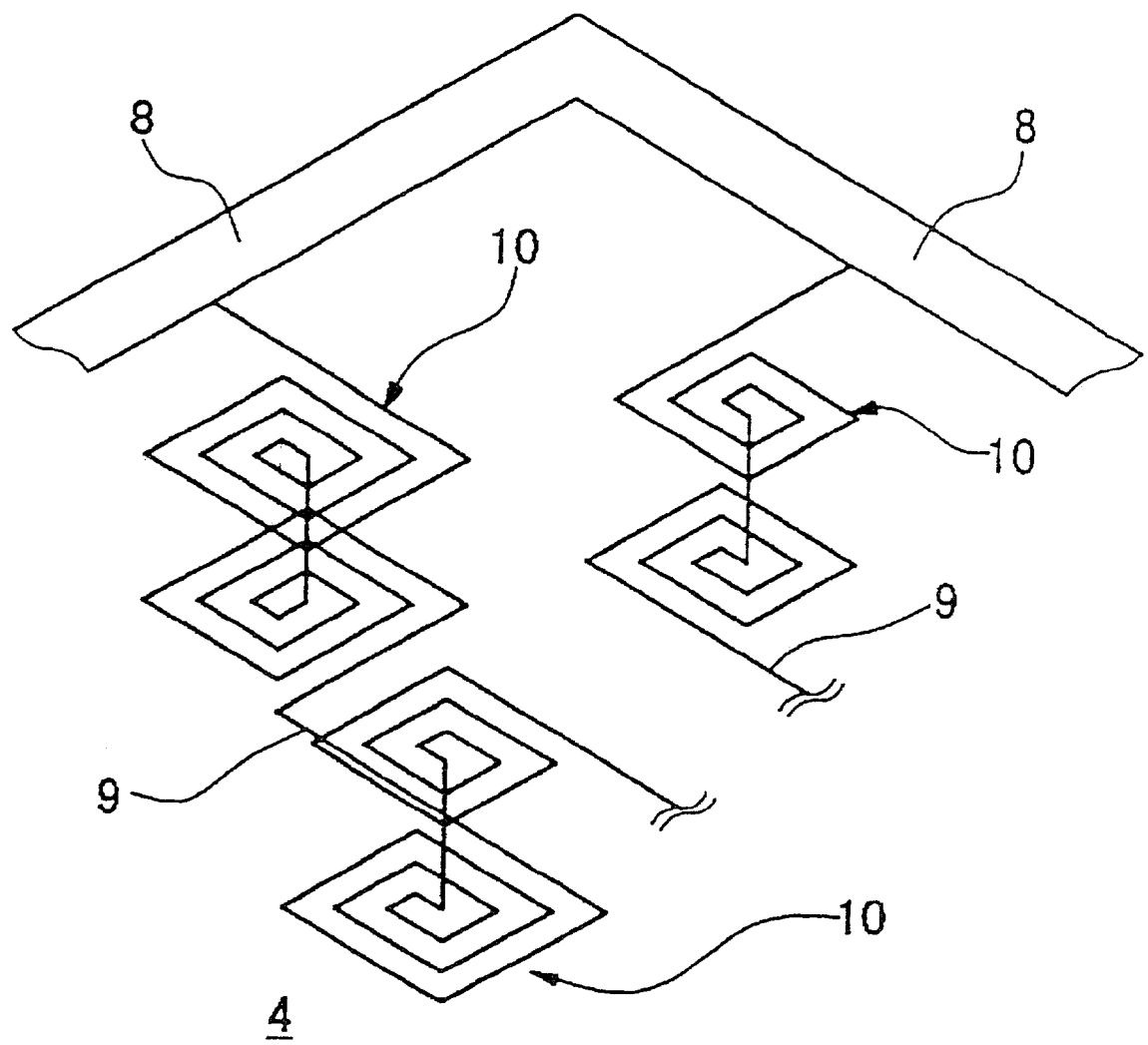
FIG. 3 is a fragmentary schematic view illustrative of the inductor devices of FIGS. 2A and 2B and main and branch lines.

FIG. 3 is a fragmentary schematic view illustrative of the inductor devices of FIGS. 2A and 2B and main and branch lines. The inductor device 10 is connected to a main line 8 which extends at the same level as one of the paired two spiral-formed interconnection structures. Adjacent two of the inductor devices 10 are connected through a branch line 9 which extends at the same level as another of the paired two spiral-formed interconnection structures.

Figure 4:
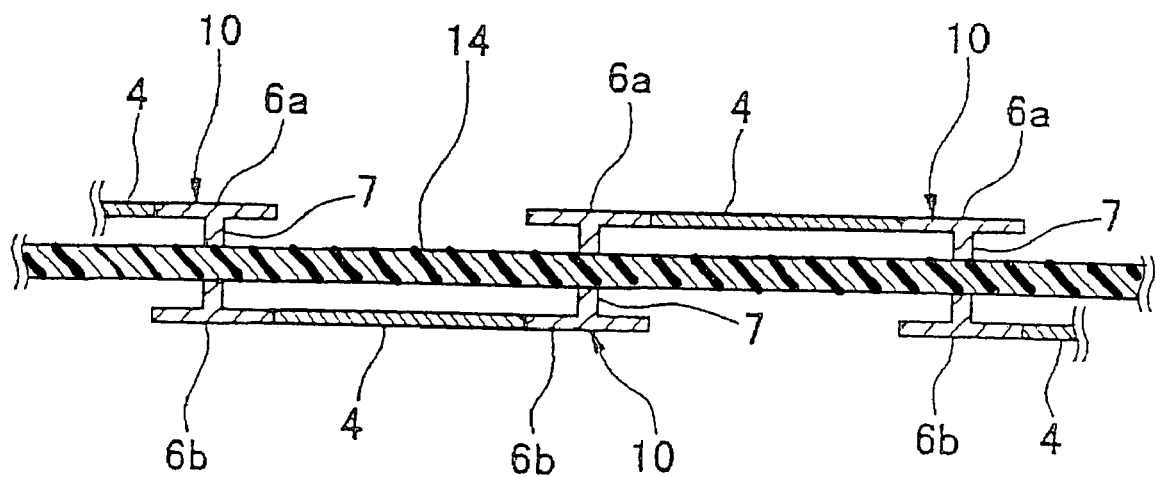
FIG. 4 is a fragmentary cross sectional elevation view illustrative of a modified inductor device, wherein an insulative magnetic layer is provided between paired two spiral-formed interconnection structures which form the inductor device.

FIG. 4 is a fragmentary cross sectional elevation view illustrative of a modified inductor device, wherein an insulative magnetic layer is provided between paired two spiral-formed interconnection structures which form the inductor device. A single insulative magnetic layer 14 is provided at an intermediate level 7 between the upper and lower power source layers 4, so that the single insulative magnetic layer 14 extends between the paired two spiral-formed interconnection structures 6a and 6b formed in the upper and lower power source layers 4. The single insulative magnetic layer 14 extends on entire regions of the substrate. The single insulative magnetic layer 14 may, for example, be made of a resin distributed with magnetic powders. Namely, the inductor device 10 comprises the paired two spiral-formed interconnection structures 6a and 6b and the single insulative magnetic layer 14. The provision of the insulative magnetic layer 14 between the first level and second level interconnections increase an inductance of the inductor device comprising the double plane spiral interconnection structure because the magnetic material contained in the insulative magnetic layer 14 has a complex relative permeability with a real part of not less than 1. The increase in inductance of the inductor further emphasizes the de-coupling of the IC or LSI. This further emphasis of the de-coupling of the IC or LSI further reduces the effective area of the loop of the high frequency current generated in the power system comprising the power source layer and a ground layer. In a frequency range, where an imaginary part of the above complex relative permeability of the magnetic material contained in the insulative magnetic layer 14 is more than 0, the magnetic material causes the loss due to the electromagnetic wave propagation. The increase of the loss due to electromagnetic wave propagation causes a further attenuation of the stationary wave generated in the power system.

Figure 5:
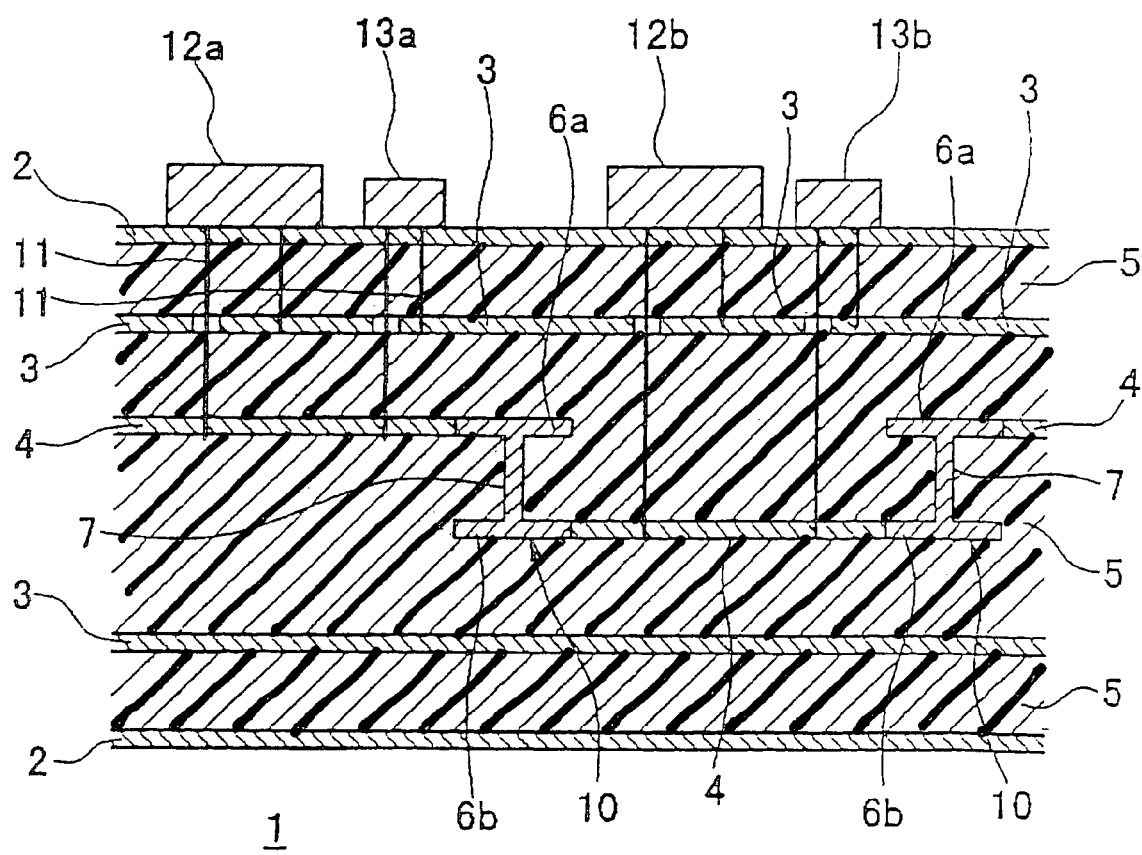
FIG. 5 is a fragmentary cross sectional elevation view illustrative of a multilayer printed board having the novel inductor devices, wherein LSI circuits and capacitors are provided on the multilayer printed board.

FIG. 5 is a fragmentary cross sectional elevation view illustrative of a multilayer printed board having the novel inductor devices, wherein LSI circuits and capacitors are provided on the multilayer printed board. The multilayer printed board has upper and lower power source layers 4 which are isolated by a dielectric layer 5. Upper and lower ground layers 3 are also provided over and under the upper and lower power source layers 4 through the dielectric layers 5. Upper and lower signal layers 2 are also provided over and under the upper and lower power source layers 4 through the dielectric layers 5 respectively. On the upper signal layer 2, LSI circuits 12a and 12b and capacitors 13a and 13b are provided. The LSI circuit 12a is connected through contact lines 11 to the upper ground layer 3 and the upper power source layer 4. The capacitor 13a is also connected through contact lines 11 to the upper ground layer 3 and the upper power source layer 4. The LSI circuit 12b is connected through contact lines 11 to the upper ground layer 3 and the lower power source layer 4. The capacitor 13b is also connected through contact lines 11 to the upper ground layer 3 and the lower power source layer 4. Each of the inductor devices 10 comprises a pair of upper and lower spiral-formed interconnection structures 6a and 6b in the upper and lower power source layers 4 respectively. The upper spiral-formed interconnection structure 6a comprises an interconnection extending in the form of a spiral in plane of the upper power source layers 4. The lower spiral-formed interconnection structure 6b comprises an interconnection extending in the form of a spiral in plane of the lower power source layers 4. The upper and lower spiral-formed interconnection structures 6a and 6b extend to form parallel planes to each other, so that the upper and lower spiral-formed interconnection structures 6a and 6b are positioned to overlap to each other and two planes formed by the upper and lower spiral-formed interconnection structures 6a and 6b face to each other. The upper and lower spiral-formed interconnection structures 6a and 6b are connected to each other to form a spiral current loop pair, wherein center portions of the upper and lower spiral-formed interconnection structures 6a and 6b are connected through a connection line 7 extending in a vertical direction to the planes of the upper and lower spiral-formed interconnection structures 6a and 6b. The connection line 7 extends through the dielectric layer 5 in the vertical direction to the planes of the upper and lower spiral-formed interconnection structures 6a and 6b. Currents flow through the spiral-formed interconnections in the same spiral directions between the paired two spiral-formed interconnection structures. The spiral shape is square and a pitch of the spiral is not more than 1 mm in order to keep a high inductance of the inductor device 10.

During operation of the LSI circuit 12a, a high frequency current flows from the LSI circuit 12a through the connection line 11 and the upper power source layer 4. A part of this high frequency current flows through the connection line 11, the capacitor 13a, the connection line 11 and the upper ground layer 3 and returned through the connection line to the LSI circuit 12a. Another part of the high frequency current flows through the inductor device 10 to the lower power source line 4, the connection line 11, the capacitor 13b, the connection line 11 and the upper ground layer 3 and returned through the connection line to the LSI circuit 12a. Namely, two different current loops are formed. The first current loop is formed by the upper power source layer 4, the capacitor 13a and the upper ground line 3. The second current loop is formed by the upper power source layer 4, the inductor device 10, the lower power source layer 4, the capacitor 13b and the upper ground line 3. As can be seen from FIG. 5, the first current loop is smaller than the second current loop. The small current loop causes a small electromagnetic noise radiation. The large current loop causes a large electromagnetic noise radiation. The power current is applied from the power source layer 4 for switching operation of the LSI circuits 12a and 12b. This power current causes variation in voltage level of the power system comprising the power source layer 4 and the ground layer 3. This variation in voltage level of the power system generates a stationary wave in the power system. In accordance with the present invention, however, the inductor device 10 is provided in the upper and lower power source layers 4. Namely, the inductor device 10 is provided in the larger current loop. The smaller current loop is, however, free of the inductor device 10. This inductor device 10 serves as a high impedance device to the high frequency current flowing through the power source layers 4. This inductor device 10 relatively decreases the second current part flowing through the second loop or the larger loop and relatively increase the first current part flowing through the first loop or the smaller loop. Namely, the inductor device 10 causes a majority of the high frequency current to flow through the first current loop which is smaller than the second current loop. As described above, the small current loop causes a small electromagnetic noise radiation, whilst the large current loop causes a large electromagnetic noise radiation. The reduction in the second current flowing through the second loop larger than the first current loop results in a certain reduction in the electromagnetic noise radiation from the power system.

A ratio of the larger current loop or the second current loop to the smaller current loop or the first current loop varies over the current frequency. Variation in ratio of the larger current loop or the second current loop to the smaller current loop or the first current loop varies over the current frequency depends upon the frequency characteristic of the inductance of the inductor device 10. At a critical frequency where the inductance value is beginning to decrease, the ratio of the larger current loop or the second current loop to the smaller current loop or the first current loop is beginning to increase.

Further, if the power source layers 4 are structured as shown in FIG. 3, then the generation of the electromagnetic wave in the power system in switching operation to the LSI circuits 12a and 12b increases the loss due to the electromagnetic wave propagation through the power system. The increase in the loss due to the electromagnetic wave propagation through the power system attenuates the stationary wave generated in the power system, whereby the radiation electromagnetic noise is suppressed.

Furthermore, if the insulative magnetic layer 14 is provided between the upper and lower spiral-formed interconnection structures 6a and 6b of the inductor device 10 as shown in FIG. 4, a further effect of suppression to the radiation electromagnetic noise can be obtained. The insulative magnetic layer 14 is provided between the upper and lower power source layers 4, so that the single insulative magnetic layer 14 extends between the paired two spiral-formed interconnection structures 6a and 6b formed in the upper and lower power source layers 4. The single insulative magnetic layer 14 extends on entire regions of the substrate. The single insulative magnetic layer 14 may, for example, be made of a resin distributed with magnetic powders. Namely, the inductor device 10 comprises the paired two spiral-formed interconnection structures 6a and 6b and the single insulative magnetic layer 14. The provision of the insulative magnetic layer 14 between the first level and second level interconnections increase an inductance of the inductor device 10 comprising the double plane spiral interconnection structure because the magnetic material contained in the insulative magnetic layer 14 has a complex relative permeability with a real part of not less than 1. The increase in inductance of the inductor further emphasizes the de-coupling of the IC or LSI. This further emphasis of the de-coupling of the IC or LSI further reduces the effective area of the loop of the high frequency current generated in the power system comprising the power source layer and a ground layers In a frequency range, where an imaginary part of the above complex relative permeability of the magnetic material contained in the insulative magnetic layer 14 is more than 0, the magnetic material causes the loss due to the electromagnetic wave propagation. The increase of the loss due to electromagnetic wave propagation causes a further attenuation of the stationary wave generated in the power system.

As examples, the number of the spiral of each of the upper and lower spiral-formed interconnection structures 6a and 6b of the inductor device 10 may be 5. The pitch 16 of the spiral may be set at 0.4 mm. The spiral shape may be square.

The insulative magnetic layer 14 may, for example, be made of a complex material of 50% by volume of an epoxy resin and 50% by volume of Ni—Zn ferrite powders.

Figure 6:
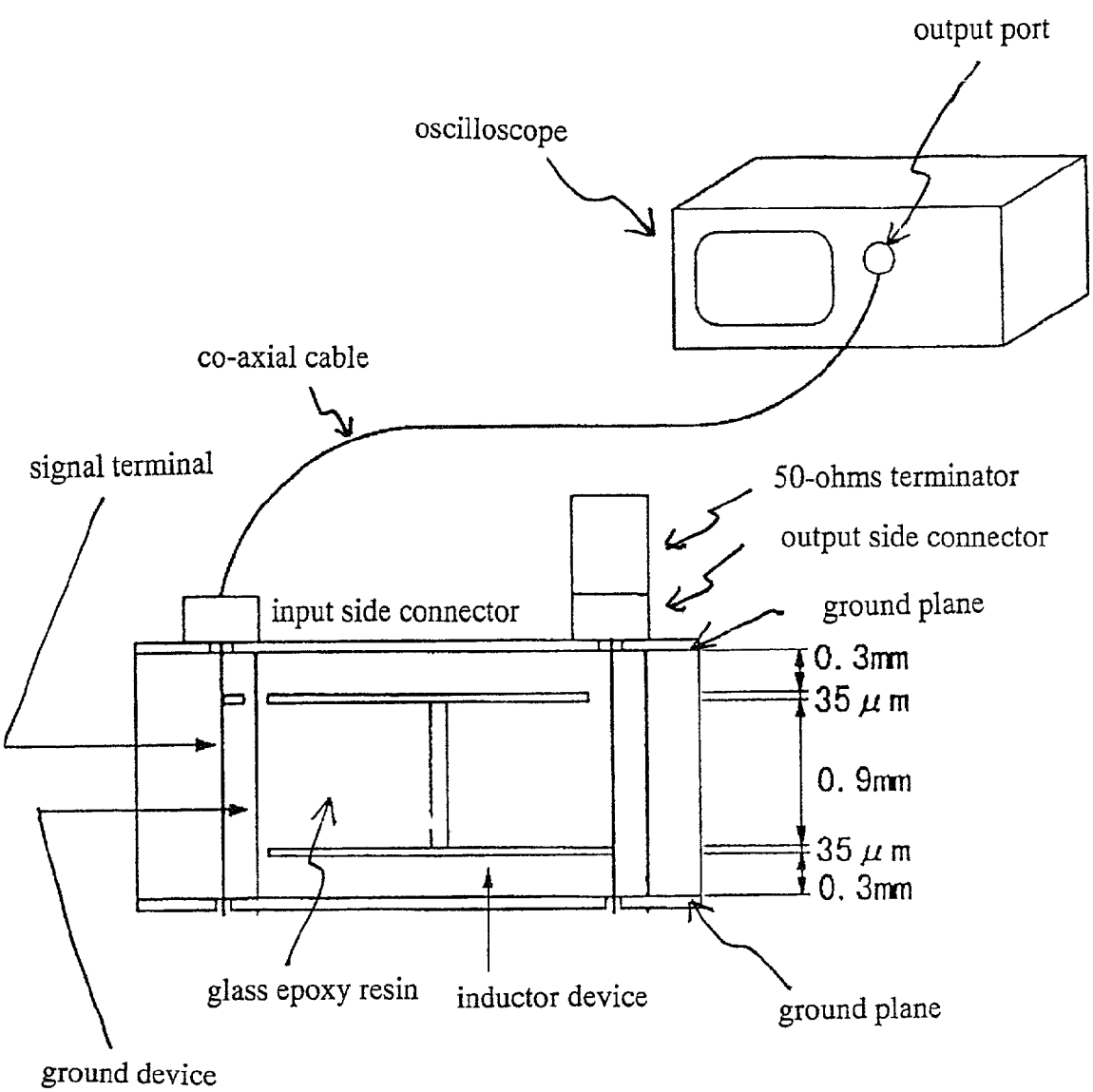
FIG. 6 is a schematic view illustrative of a measuring system for measuring a characteristic impedance of the inductor device shown in FIG. 2.
Figure 7:
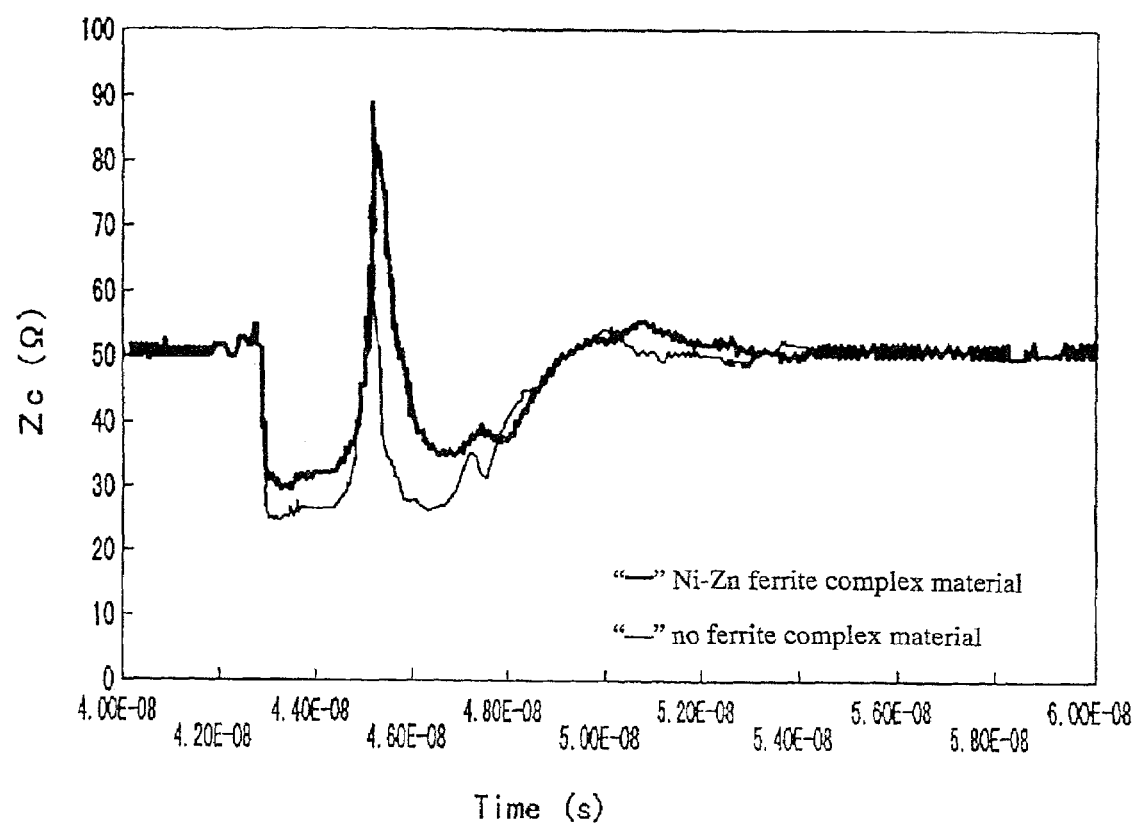
FIG. 7 is a diagram illustrative of variation in characteristic impedance of the inductor device in a time domain reflectometry by use of the measuring system of FIG. 6.

FIG. 6 is a schematic view illustrative of a measuring system for measuring a characteristic impedance of the inductor device shown in FIG. 2. FIG. 7 is a diagram illustrative of variation in characteristic impedance of the inductor device in a time domain reflectometry by use of the measuring system of FIG. 6. The number of the spiral of each of the upper and lower spiral-formed interconnection structures 6a and 6b of the inductor device 10 is 5. The pitch 16 of the spiral is 0.4 mm. The spiral shape may be square. Measured for the characteristic impedance are both the first type inductor device 10 including the insulative magnetic layer 14 made of a complex material of an epoxy resin and Ni—Zn ferrite powders with a thickness of 0.2 mm and the second type inductor device 10 free of the insulative magnetic layer 14. In FIG. 7, a region in the vicinity of 50 ohms in characteristic impedance represents a co-axial cable or a 50 ohms terminator, whilst other regions represent characteristics of the inductor device 10 over individual positions. "–" represents the characteristic impedance of the first type inductor device 10 including the insulative magnetic layer 14 made of a complex material of an epoxy resin and Ni—Zn ferrite powders with a thickness of 0.2 mm, "–" represents the characteristic impedance of the second type inductor device 10 free of the insulative magnetic layer 14.

At the center position of the inductor device 10, a sharp peak appears which represents a rapid increase in the characteristic impedance of the inductor device 10. This inductor device 10 serves as a high impedance device to the high frequency current in operation of the IC or LSI circuits 12a and 12b. Namely, the inductor device 10 is provided in the larger current loop. The smaller current loop is, however, free of the inductor device 10. This inductor device 10 serves as a high impedance device to the high frequency current flowing through the power source layers 4. This inductor device 10 relatively decreases the second current part flowing through the second loop or the larger loop and relatively increase the first current part flowing through the first loop or the smaller loop. Namely, the inductor device 10 causes that the majority of the high frequency current flows through the first current loop which is smaller than the second current loop. As described above, the small current loop causes a small electromagnetic noise radiation, whilst the large current loop causes a large electromagnetic noise radiation. The reduction in the second current flowing through the second loop larger than the first current loop results in a certain reduction in the electromagnetic noise radiation from the power system.

Figure 8:
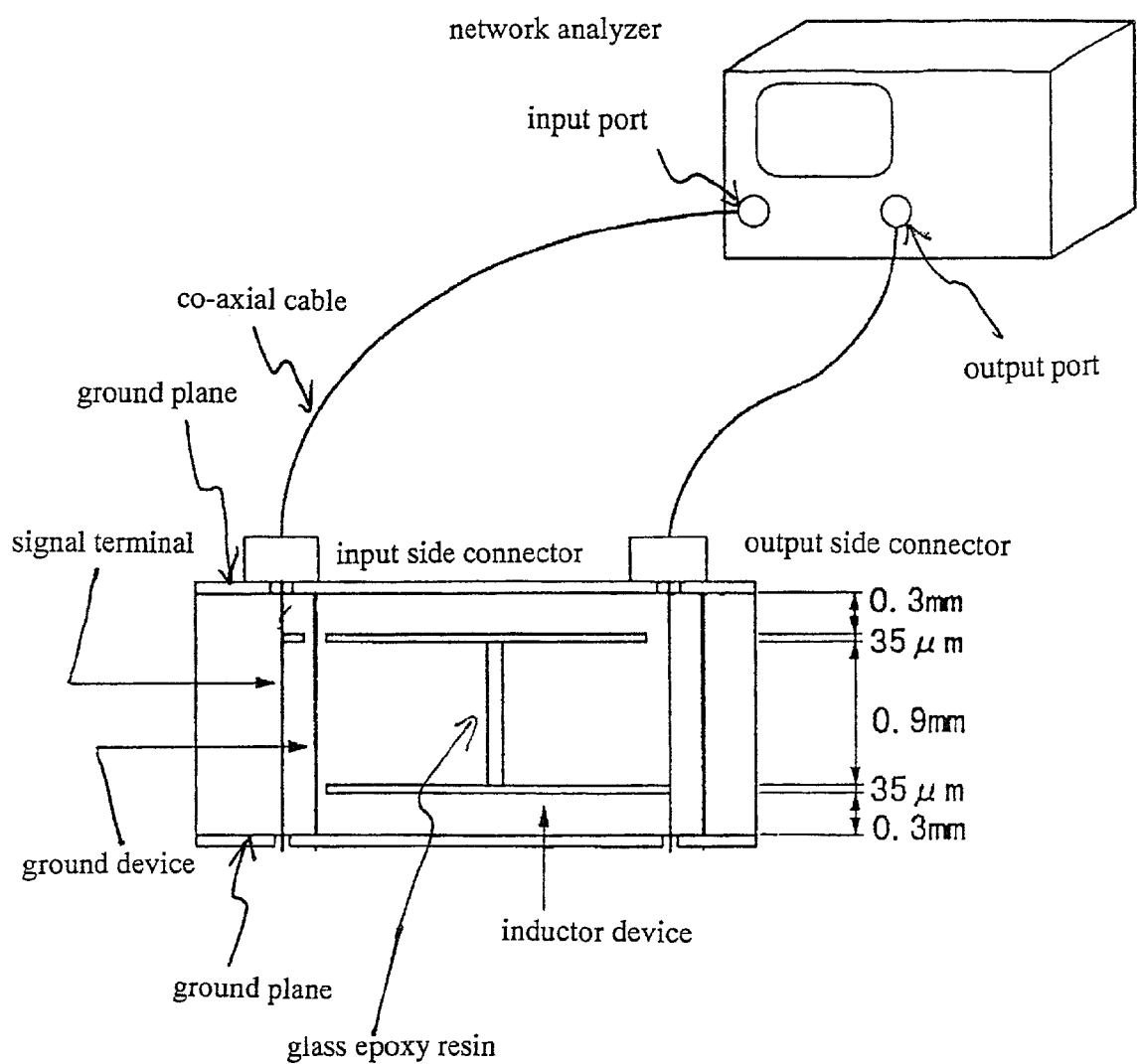
FIG. 8 is a schematic view illustrative of a measuring system for measuring an S-parameter of the inductor device shown in FIG. 2.
Figure 9:
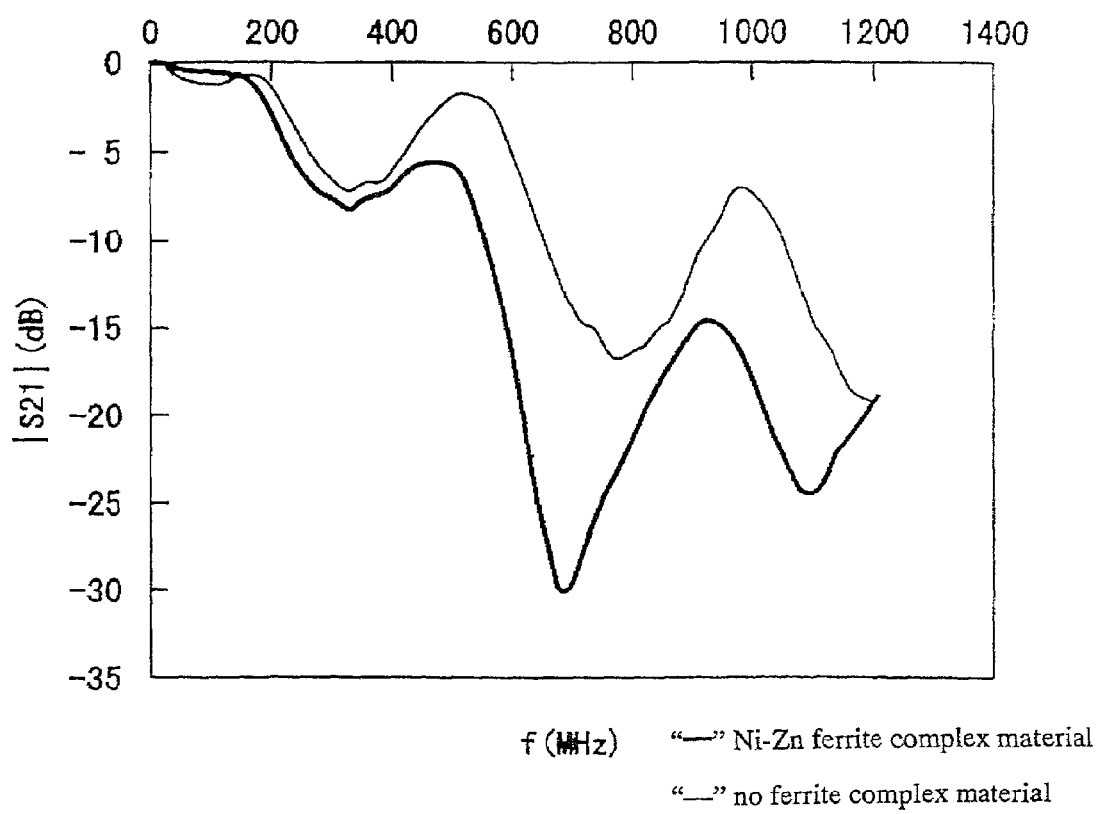
FIG. 9 is a diagram illustrative of variation in |S21| of the inductor device over frequency by use of the measuring system of FIG. 8.

FIG. 8 is a schematic view illustrative of a measuring system for measuring an S-parameter of the inductor device shown in FIG. 2. FIG. 9 is a diagram illustrative of variation in |S21| of the inductor device over frequency by use of the measuring system of FIG. 8. The number of the spiral of each of the upper and lower spiral-formed interconnection structures 6a and 6b of the inductor device 10 is 5. The pitch 16 of the spiral is 0.4 mm. The spiral shape may be square. Measured for the characteristic impedance are both the first type inductor device 10 including the insulative magnetic layer 14 made of a complex material of an epoxy resin and Ni—Zn ferrite powders with a thickness of 0.2 mm and the second type inductor device 10 free of the insulative magnetic layer 14. In FIG. 9, "–" represents the variation in |S21| over frequency of the first type inductor device 10 including the insulative magnetic layer 14 made of a complex material of an epoxy resin and Ni—Zn ferrite powders with a thickness of 0.2 mm. "–" represents the variation in |S21| over frequency of the second type inductor device 10 free of the insulative magnetic layer 14. The maximum value of |S21| to the inductor device 10 decreases as the frequency is increased. This decrease is caused by the loss due to the electromagnetic wave propagation. In a high frequency band of not less than about 160 MHz, the first type inductor device 10 having the insulative magnetic layer 14 is smaller in |S21| than the second type inductor device 10 free of the insulative magnetic layer 14 due to the increased loss by the electromagnetic wave propagation due to existence of the imaginary part of the complex relative permeability of the complex material for the insulative magnetic layer 14.

As described above, the inductor device 10 comprises the paired two spiral-formed interconnection structures. This inductor device 10 is provided in the power source layer 4 but in the vicinity of the IC or LSI. This inductor device 10 provides a high impedance to the high frequency current flowing through the power system in the multilayer printed board. This high impedance to the high frequency current causes that a majority of the high frequency current flowing from the IC or LSI through the power source layer is by-passed to a capacitor which is positioned nearest thereto, thereby to reduce a high frequency current loop formed in the power system of the multilayer printed board.

The inductor device 10 also serves to attenuate the stationary wave to be generated in the power source layer in the multilayer printed board. The above paired two spiral-formed interconnection structures increase the loss in the electromagnetic wave propagation through the power system in the multilayer printed board.

Accordingly, the inductor device 10 suppresses the electromagnetic noises radiated from the power system in the multilayer printed circuit board.

Figure 10:
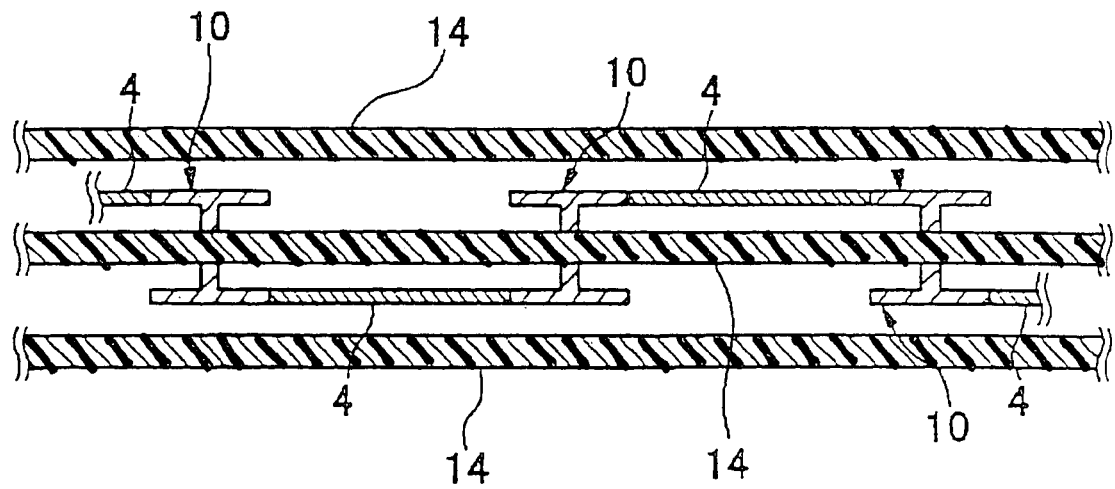
FIG. 10 is a fragmentary cross sectional elevation view illustrative of a further modified inductor device, wherein a single inner insulative magnetic layer is provided between paired two spiral-formed interconnection structures which form the inductor device and further paired two outer insulative magnetic layers are provided so that the upper and lower power source layers are positioned between the paired two insulative magnetic layers.

Second Embodiment:

A second embodiment according to the present invention will be described in detail with reference to the drawings. FIG. 10 is a fragmentary cross sectional elevation view illustrative of a further modified inductor device, wherein a single inner insulative magnetic layer is provided between paired two spiral-formed interconnection structures which form the inductor device and further paired two outer insulative magnetic layers are provided so that the upper and lower power source layers are positioned between the paired two insulative magnetic layers. A single inner insulative magnetic layer 14 is provided at an intermediate level 7 between the upper and lower power source layers 4, so that the single inner insulative magnetic layer 14 extends between the paired two spiral-formed interconnection structures 6a and 6b formed in the upper and lower power source layers 4. The single inner insulative magnetic layer 14 extends on entire regions of the substrate. Further, paired two outer insulative magnetic layers 14 are provided to sandwich the upper and lower power source layers 4 so that the upper and lower power source layers 4 are positioned between the paired two outer insulative magnetic layers 14. The singe inner insulative magnetic layer 14 and the paired two outer insulative magnetic layers 14 may, for examples be made of a resin distributed with magnetic powders. Namely, the inductor device 10 comprises the paired two spiral-formed interconnection structures 6a and 6b and the single insulative magnetic layer 14. The provision of the single inner insulative magnetic layer 14 between the first level and second level interconnections and the further provision of the paired two outer insulative magnetic layers 14 to sandwich the upper and lower power source layers 4 increase an inductance of the inductor device comprising the double plane spiral interconnection structure because the magnetic material contained in the insulative magnetic layers 14 has a complex relative permeability with a real part of not less than 1. The increase in inductance of the inductor further emphasizes the de-coupling of the IC or LSI. This further emphasis of the de-coupling of the IC or LSI further reduces the effective area of the loop of the high frequency current generated in the power system comprising the power source layer and a ground layer. In a frequency range, where an imaginary part of the above complex relative permeability of the magnetic material contained in the insulative magnetic layers 14 is more than 0, the magnetic material causes the loss due to the electromagnetic wave propagation. The increase of the loss due to electromagnetic wave propagation causes a further attenuation of the stationary wave generated in the power system.

Figure 11:
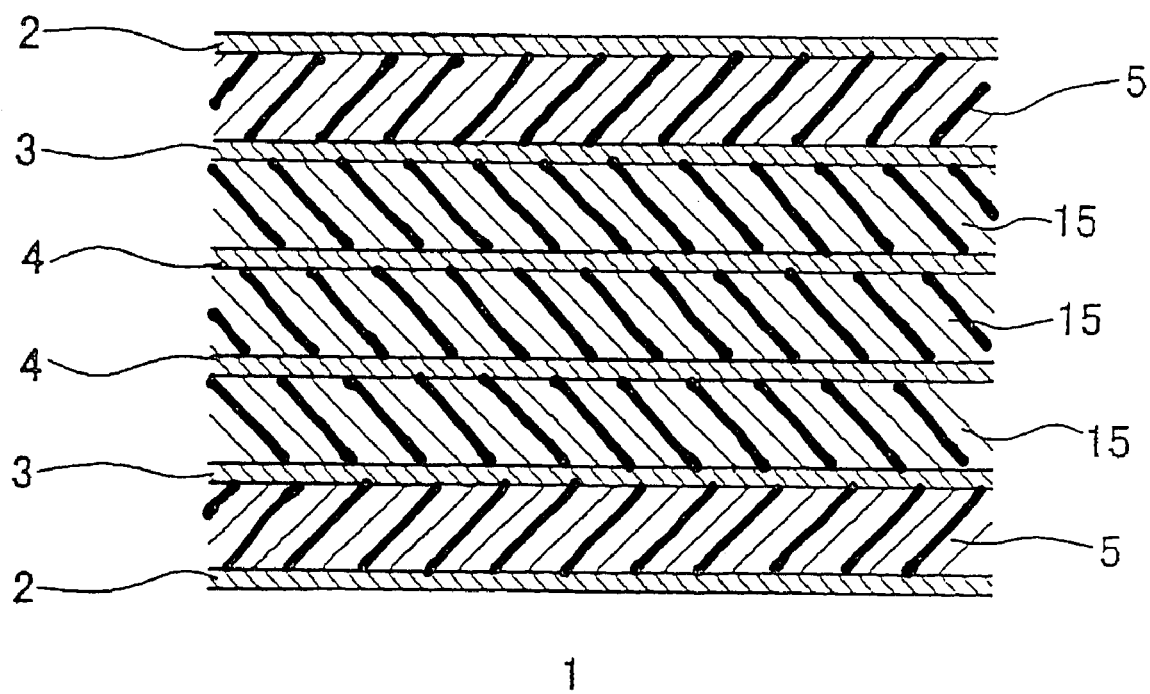
FIG. 11 is a fragmentary cross sectional elevation view illustrative of another multilayer printed board to which the present invention is applied in a third preferred embodiment in accordance with the present invention.

Third Embodiment:

A third embodiment according to the present invention will be described in detail with reference to the drawings. FIG. 11 is a fragmentary cross sectional elevation view illustrative of another multilayer printed board to which the present invention is applied in a third preferred embodiment in accordance with the present invention. The multilayer printed board comprises alternating laminations of a plurality of first and second type dielectric layers 5 and 15 and signals layers 2, ground layers 3 and power source layers 4. The second type dielectric layers 15 have a larger dielectric loss than the first type dielectric layers 15. One of the second type dielectric layers 15 is sandwiched between the two power source layers 4. The two power source layers 4 are further sandwiched between the remaining two second type dielectric layers 15 to form a five layer lamination structure. This five layer lamination structure is further sandwiched between the two ground layers 3 to form a seven layer lamination structure. This seven layer lamination structure is further sandwiched between the two first type dielectric layers 5 to form a nine layer lamination structure. This nine layer lamination structure is furthermore sandwiched between the signal layers 2. In this embodiment, the second type dielectric layers 15 which have a larger dielectric loss than the first type dielectric layers 5, so as to attenuate the stationary wave generated in the power system comprising the power source layer and the ground layer, whereby the radiation electromagnetic noise from the power system is further reduced.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within spirit and scope of the present invention.

What is claimed is:

1. A multilayer printed board having plural signal layers, plural power source layers, plural ground layers, and said multilayer printed board also having at least a first high frequency current loop with a first loop area and a second high frequency current loop with a second loop area which is larger than said first loop area, and said first high frequency current loop and the second high frequency current loop have a partially common current path,
   wherein said multilayer printed board further has at least an inductor device in said plural power source layers, so that said first frequency current loop has a first current path including any one of said paired power source layers and excluding said inductor device and remaining one of said paired power source layers, and
   wherein said at least inductor device comprises plural spiral-shaped interconnection structures being connected to each other and extending in plural power source layers differing in level in a multilayer printed board.

2. The multilayer printed board as claimed in claim 1, wherein said plural spiral-shaped interconnection structures comprises first and second spiral-shaped interconnection structures extending in first and second power source layers in first and second levels, respectively.

3. The multilayer printed board as claimed in claim 1, wherein said plural spiral-shaped interconnection structures extend in plane and are connected to each other at these center portions.

4. The multilayer printed board as claimed in claim 1, wherein said plural spiral-shaped interconnection structures have the same current directions as each other.

5. The multilayer printed board as claimed in claim 1, wherein each of said plural spiral-shaped interconnection structures has a spiral pitch of not more than 1 mm.

6. The multilayer printed board as claimed in claim 1, further comprising an inside insulative magnetic layer between adjacent two of said plural spiral-shaped interconnection structures.

7. The multilayer printed board as claimed in claim 6, wherein said inside insulative magnetic layer comprises a mixture of a resin material and magnetic powders.

8. The multilayer printed board as claimed in claim 6, further comprising outside insulative magnetic layers in opposite sides of said plural power source layers so that said plural power source layers are positioned between said outside insulative magnetic layers.

9. The multilayer printed board as claimed in claim 8, wherein said outside insulative magnetic layers comprise a mixture of a resin material and magnetic powders.

10. A multilayer printed board having plural signal layers, plural power source layers, plural ground layers, and said multilayer printed board also having at least a first high frequency current loop with a first loop area and a second high frequency current loop with a second loop area which is larger than said first loop area, and said first high frequency current loop and the second high frequency current loop having a partially common current path, wherein said multilayer printed board further has at least an inductor device in said plural power source layers, so that said first frequency current loop has a first current path including any one of said paired power source layers and excluding said inductor device and remaining one of said paired power source layers, and wherein in said multilayer printed board, dielectric layers sandwiching said power source layers are higher in dielectric loss than other dielectric layers.

* * * * *